United States Patent
Sato et al.

(10) Patent No.: US 10,819,346 B2
(45) Date of Patent: Oct. 27, 2020

(54) TEMPERATURE-COMPENSATED VOLTAGE GENERATING CIRCUIT, OSCILLATOR MODULE, SYSTEM AND METHOD

(71) Applicant: Asahi Kasei Microdevices Corporation, Tokyo (JP)

(72) Inventors: Takayuki Sato, Tokyo (JP); Hideaki Hirose, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 16/672,521

(22) Filed: Nov. 4, 2019

(65) Prior Publication Data
US 2020/0145011 A1  May 7, 2020

(30) Foreign Application Priority Data

Nov. 5, 2018   (JP) .................................. 2018-208361

(51) Int. Cl.
*H03B 5/04*  (2006.01)
*H03B 5/32*  (2006.01)
*H03L 1/02*  (2006.01)

(52) U.S. Cl.
CPC ............... *H03L 1/022* (2013.01); *H03B 5/04* (2013.01); *H03B 5/32* (2013.01); *H03L 1/028* (2013.01)

(58) Field of Classification Search
CPC ....... H03B 5/04; H03B 5/30–368; H03L 1/02; H03L 1/022–026; H03L 1/028
See application file for complete search history.

(56) References Cited

U.S. PATENT DOCUMENTS

| | | | | | |
|---|---|---|---|---|---|
| 4,560,959 | A | * | 12/1985 | Rokos | G05F 3/225 331/116 R |
| 5,041,799 | A | * | 8/1991 | Pirez | H03L 1/025 331/158 |
| 5,473,289 | A | * | 12/1995 | Ishizaki | H03L 1/023 331/116 R |
| 5,691,671 | A | * | 11/1997 | Bushman | H03L 1/022 331/158 |
| 5,874,864 | A | * | 2/1999 | Muto | H03L 1/025 331/108 D |

(Continued)

FOREIGN PATENT DOCUMENTS

| | | |
|---|---|---|
| JP | S60154716 | 8/1985 |
| JP | H05145339 | 6/1993 |

(Continued)

*Primary Examiner* — Levi Gannon
(74) *Attorney, Agent, or Firm* — JCIPRNET

(57) ABSTRACT

Provided is a temperature-compensated voltage generating circuit that generates a temperature-compensated voltage which is supplied to an oscillator circuit. The temperature-compensated voltage generating circuit includes a temperature detecting circuit that detects a temperature; a high frequency attenuating part that attenuates at least a part of a frequency component which is higher than a direct-current component of an output of the temperature detecting circuit; an adder that adds the output of the temperature detecting circuit and an output of the high frequency attenuating part; and a compensated voltage generating part that generates the temperature-compensated voltage based on an output of the adder.

15 Claims, 14 Drawing Sheets

(56) References Cited

U.S. PATENT DOCUMENTS

| | | | | |
|---|---|---|---|---|
| 6,292,066 | B1 * | 9/2001 | Shibuya | H03B 5/368 331/176 |
| 6,584,380 | B1 * | 6/2003 | Nemoto | H03L 1/022 331/158 |
| 7,755,416 | B2 * | 7/2010 | Kiyohara | H03L 1/022 327/512 |
| 2002/0158700 | A1 * | 10/2002 | Nemoto | H03B 5/32 331/158 |
| 2007/0229176 | A1 * | 10/2007 | Fukuda | H03B 5/368 331/158 |
| 2009/0108949 | A1 * | 4/2009 | Yan | H03B 5/04 331/158 |
| 2014/0070990 | A1 * | 3/2014 | Josefiak | G01S 19/23 342/357.62 |
| 2018/0241401 | A1 * | 8/2018 | Aylward | H03L 1/028 |

FOREIGN PATENT DOCUMENTS

| | | |
|---|---|---|
| JP | H0629742 | 2/1994 |
| JP | 2006287651 | 10/2006 |
| JP | 2007267246 | 10/2007 |
| JP | 2008028766 | 2/2008 |
| JP | 2008258710 | 10/2008 |
| JP | 2017108443 | 6/2017 |

\* cited by examiner

FIG. 4A
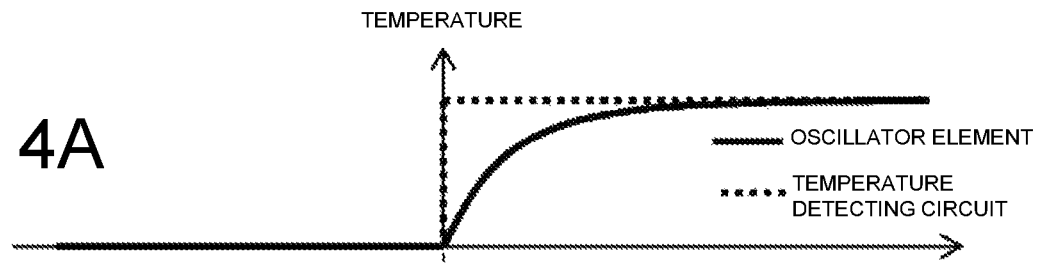
FIG. 4B
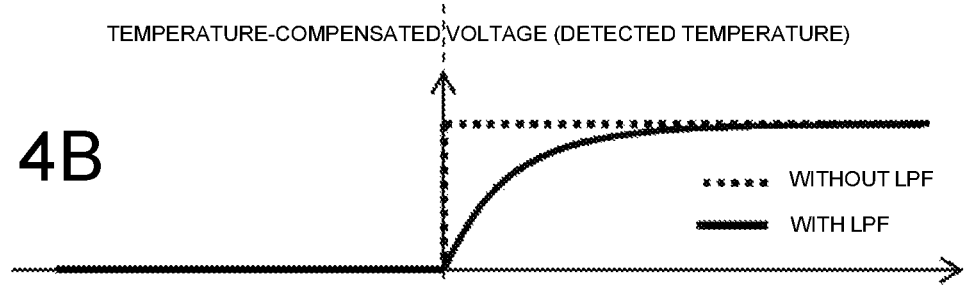
FIG. 4C
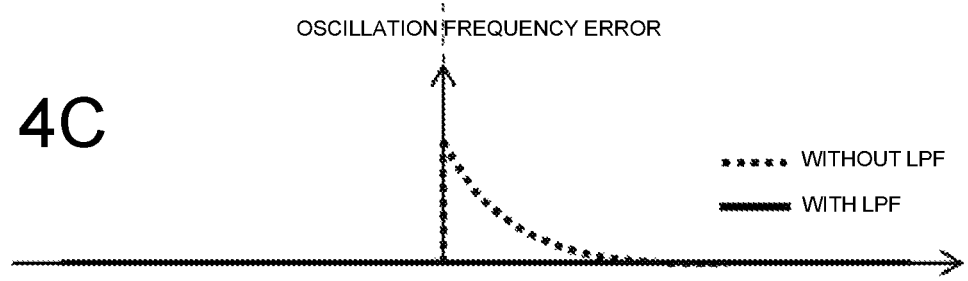
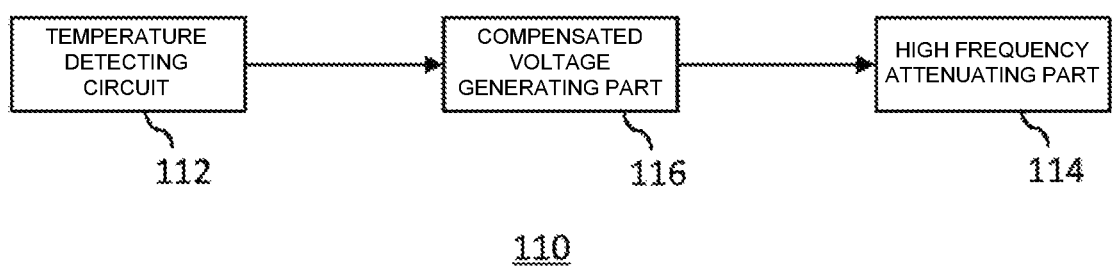
FIG. 5

114

114

US 10,819,346 B2

TEMPERATURE-COMPENSATED VOLTAGE GENERATING CIRCUIT, OSCILLATOR MODULE, SYSTEM AND METHOD

CROSS REFERENCE TO RELATED APPLICATIONS

This application claims the priority benefit of Japanese Patent Application No. 2018-208361, filed on Nov. 5, 2018. The entirety of the above-mentioned patent application is hereby incorporated by reference herein and made a part of this specification.

BACKGROUND

Technical Field

The present disclosure relates to a temperature-compensated voltage generating circuit, an oscillator module, and a system.

Description of Related Art

A crystal oscillator module including a crystal oscillator circuit is used to generate a clock signal or the like in many electronic devices. An oscillation frequency of a crystal oscillator circuit may be stable with respect to change in ambient temperature. For example, a crystal oscillator with a temperature compensation function for reducing a variation in oscillation frequency due to an increase in temperature of a temperature sensor at the time of power-up is known (Patent Document 1: Japanese Patent Laid-Open No. 2007-267246). However, with such a technique, frequency characteristics may deteriorate when the change in temperature of the crystal resonator is slower than the change in temperature of a temperature sensor, or the like.

SUMMARY

The present disclosure provides a delicate temperature compensation function using an oscillator module.

According to one embodiment of the disclosure, a temperature-compensated voltage generating circuit is provided that generates a temperature-compensated voltage which is supplied to an oscillator circuit. The temperature-compensated voltage generating circuit includes a temperature detecting circuit that detects a temperature; a high frequency attenuating part that attenuates at least a part of a frequency component which is higher than a direct-current component of an output of the temperature detecting circuit; an adder that adds the output of the temperature detecting circuit and an output of the high frequency attenuating part; and a compensated voltage generating part that generates the temperature-compensated voltage based on an output of the adder.

According to another embodiment of the disclosure, a temperature-compensated voltage generating circuit is provided that generates a temperature-compensated voltage which is supplied to an oscillator circuit. The temperature-compensated voltage generating circuit includes a temperature detecting circuit that detects a temperature; a compensated voltage generating part that generates the temperature-compensated voltage based on an output of the temperature detecting circuit; and a high frequency attenuating part that attenuates at least a part of a high frequency component of an output of the compensated voltage generating part.

The above-mentioned summary of the present disclosure does not include all necessary features of the present disclosure. Sub-combinations of the features can also define the present disclosure.

BRIEF DESCRIPTION OF THE DRAWINGS

FIGS. 4A-4C illustrate an example of a detected temperature, an oscillator element temperature, and a frequency error in the embodiment.

FIG. 5 illustrates an example of a configuration of a temperature-compensated voltage generating circuit according to a first modified example of the embodiment.

DESCRIPTION OF THE EMBODIMENTS

Hereinafter, the present disclosure will be described in conjunction with embodiments of the present disclosure, but the following embodiments do not limit the present disclosure described in the appended claims. All combinations of features which are described in the embodiments are not necessarily essential to the present disclosure.

Figure 1:
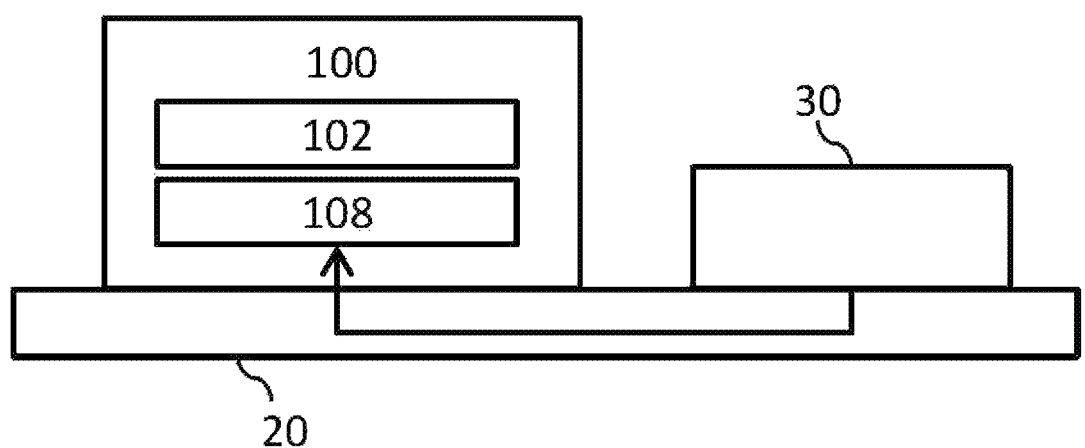
FIG. 1 illustrates an example of a configuration of a system according to an embodiment.

FIG. 1 illustrates an example of a configuration of a system 10 according to an embodiment. The system 10 generates an oscillation signal which has been highly temperature-compensated with respect to change in temperature due to emission of heat from a high power device. The system 10 includes a system substrate 20, a high power device 30, and an oscillator module 100.

The system substrate 20 has the high power device 30 and the oscillator module 100 mounted thereon. The system substrate 20 may be a wired board that electrically connects the high power device 30 and the oscillator module 100. As will be described later, the system substrate 20 may have another device and/or another circuit mounted thereon.

The high power device 30 may be one or more electronic circuits having various functions. For example, the high power device 30 may include a communication circuit, a radio power amplifier, and a signal processing circuit. The high power device 30 emits heat at the time of operation and the heat is transmitted to the oscillator module 100 via the system substrate 20. An example of transmission of heat from the high power device 30 is indicated by an arrow in the drawing.

The oscillator module 100 includes an oscillator element 102 and an integrated circuit 108 and generates an oscillation signal such as a clock signal using the oscillator element 102. The oscillator element 102 may be a resonator that oscillates in response to an electrical signal of a crystal resonator or the like. The integrated circuit 108 may be a circuit in which a plurality of elements and/or circuits and the like are integrated on a substrate as will be described later.

Figure 2:
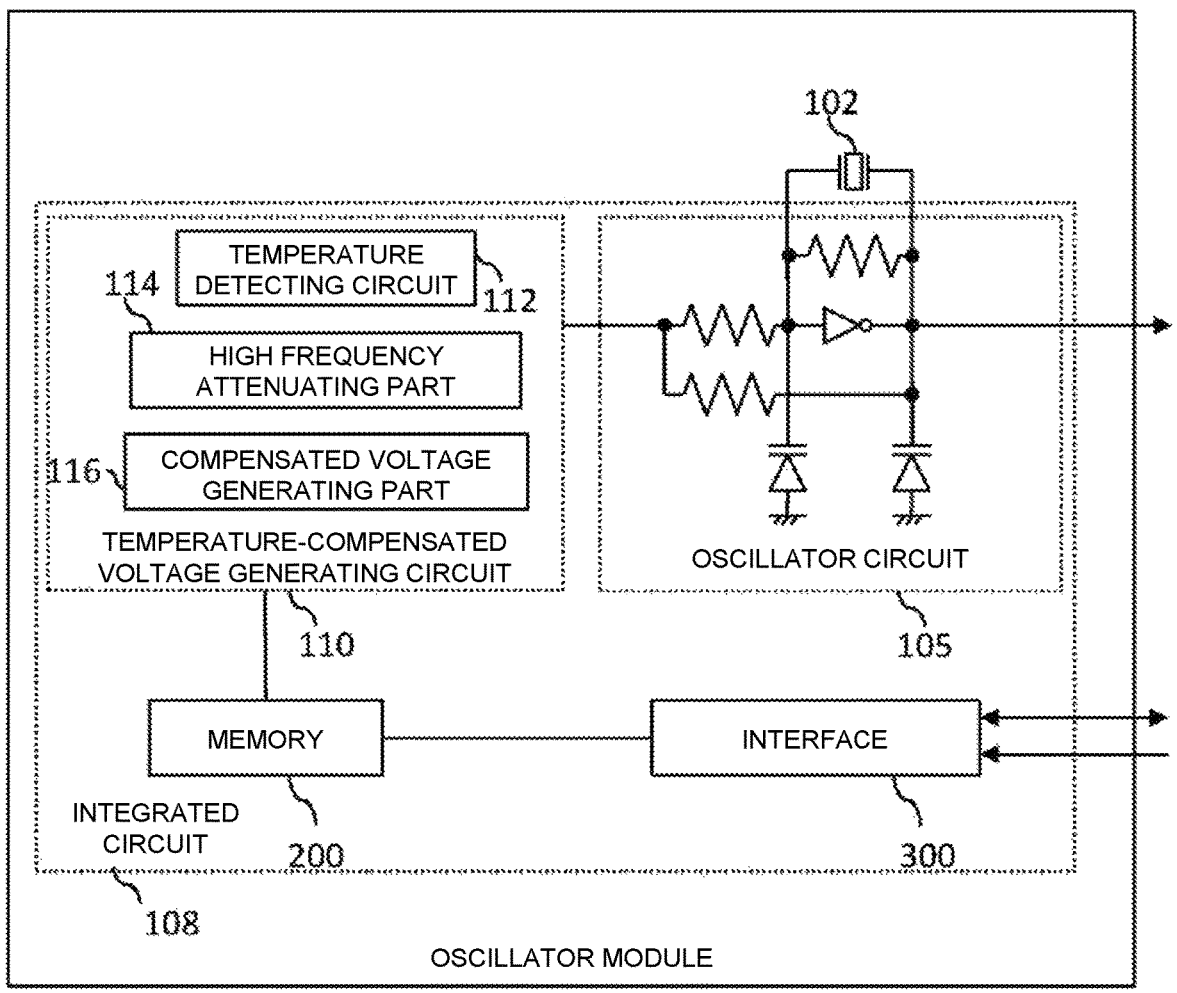
FIG. 2 illustrates an example of a configuration of an oscillator module according to the embodiment.

FIG. 2 illustrates an example of a configuration of the oscillator module 100 according to the embodiment. The oscillator module 100 may include an oscillator element 102 and an integrated circuit 108. The integrated circuit 108 includes an oscillator circuit 105 and a temperature-compensated voltage generating circuit 110. The integrated circuit 108 may include a memory 200 and an interface 300. The integrated circuit 108 may include a fuse in addition to or instead of the memory 200.

The oscillator circuit 105 drives the oscillator element 102 such as a crystal resonator based on a temperature-compensated voltage. The oscillator circuit 105 may generate a clock signal using the oscillator element 102 and provide the generated clock signal to an external circuit such as the high power device 30. The oscillator circuit 105 may be provided close to the temperature-compensated voltage generating circuit 110.

The oscillator circuit 105 may have, for example, a circuit configuration illustrated in FIG. 2. Accordingly, the oscillator circuit 105 generates a clock signal or the like based on a voltage output which is generated by the temperature-compensated voltage generating circuit 110.

The temperature-compensated voltage generating circuit 110 includes a temperature detecting circuit and generates a temperature-compensated voltage which is supplied to the oscillator circuit 105 based on a temperature which is detected by the temperature detecting circuit. The temperature-compensated voltage which is generated by the temperature-compensated voltage generating circuit 110 is supplied to the oscillator circuit 105 and thus the oscillator circuit 105 drives the oscillator element 102. Accordingly, the temperature-compensated voltage generating circuit 110 decreases a degree of an oscillation frequency of the oscillator element 102 being affected by change in ambient temperature.

As illustrated in FIG. 1, when the integrated circuit 108 is provided close to the system substrate 20 and the oscillator element 102 is provided distant from the system substrate 20, heat from the high power device 30 is transmitted to the integrated circuit 108 earlier than the oscillator element 102. As a result, a temperature difference is caused between the oscillator element 102 and the integrated circuit 108.

The temperature-compensated voltage generating circuit 110 provided in the integrated circuit 108 generates the temperature-compensated voltage based on a temperature which is higher than the actual temperature of the oscillator element 102. Accordingly, in a module according to the related art, a signal from the oscillator circuit 105 may include an oscillation frequency error until the temperatures of the oscillator element 102 and the temperature-compensated voltage generating circuit 110 become equal. On the other hand, the temperature-compensated voltage generating circuit 110 according to the embodiment decreases or removes an oscillation frequency error based on such a temperature difference as will be described later.

The temperature-compensated voltage generating circuit 110 includes a temperature detecting circuit 112, a high frequency attenuating part 114, and a compensated voltage generating part 116.

The temperature detecting circuit 112 is a circuit that serves as a temperature sensor in the oscillator module 100. A known circuit including an IC temperature sensor, a thermistor, or a resistance thermometer can be used as the temperature detecting circuit 112. The temperature detecting circuit 112 detects an ambient temperature and generates a signal including the detected temperature information to at least one of the high frequency attenuating part 114 and the compensated voltage generating part 116.

The high frequency attenuating part 114 attenuates at least a part of a high frequency component of a signal input thereto and generates the attenuated signal. For example, the high frequency attenuating part 114 may attenuate at least a part of a high frequency component of an output of the temperature detecting circuit 112 or at least a part of a high frequency component of an output of the temperature-compensated voltage.

A known circuit may be used as the high frequency attenuating part 114. For example, the high frequency attenuating part 114 may include at least one of a low pass filter, an integrator, a step wave generating circuit, and a ramp wave generating circuit. For example, the high frequency attenuating part 114 may be a low pass filter (LPF) including a Gm-C filter. When the high frequency attenuating part 114 is a step wave generating circuit, the high frequency attenuating part 114 may generate step waves of one stage or multiple stages.

The compensated voltage generating part 116 generates a temperature-compensated voltage which is supplied to the oscillator circuit 105. For example, the compensated voltage generating part 116 may generate the temperature-compensated voltage based on an output of the high frequency attenuating part 114 or an output of the temperature detecting circuit 112. The compensated voltage generating part 116 may include a circuit corresponding to a function for approximating the change in temperature of the oscillator element 102. For example, the compensated voltage generating part 116 may include at least a part of a zeroth-order function generating circuit, a linear function generating circuit, and an Nth-order function generating circuit (where N is equal to or greater than 2 and, for example, may be 3). For example, the compensated voltage generating part 116 may have the same configuration as a crystal oscillator with a temperature compensation function which is described in Patent Document 1.

The memory 200 stores parameters related to the temperature-compensated voltage generating circuit 110. For example, the memory 200 may store parameters such as an offset of the temperature detecting circuit 112, a cut-off frequency of the high frequency attenuating part 114, and/or coefficients of the zeroth-order, linear, and Nth-order functions of the compensated voltage generating part 116. Instead of allowing the integrated circuit 108 to include the memory 200 and the interface 300, the memory 200 or the interface 300 may be provided outside the integrated circuit 108. The memory 200 may include, for example, a nonvolatile memory such as an EEPROM. Instead, the memory 200 may be a fuse.

The interface 300 relays connection between the memory 200 and the outside. For example, the interface 300 may receive data related to the parameters from the outside and write the received data to the memory 200. Writing to the memory 200 may be performed at the time of initial setting before the oscillator module 100 is shipped or during operation.

Figure 3:
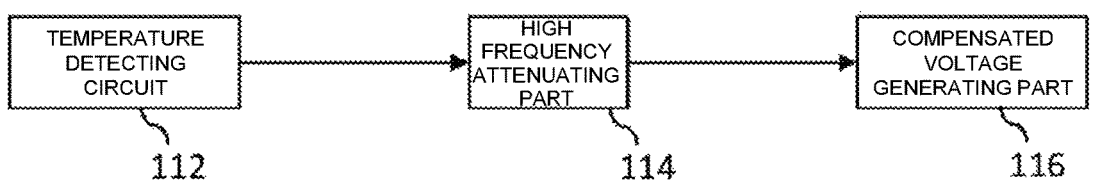
FIG. 3 illustrates an example of a configuration of a temperature-compensated voltage generating circuit according to the embodiment.

FIG. 3 illustrates an example of a configuration of the temperature-compensated voltage generating circuit 110 according to the embodiment. In this example, the temperature-compensated voltage generating circuit 110 includes a temperature detecting circuit 112, a high frequency attenuating part 114, and a compensated voltage generating part 116. The high frequency attenuating part 114 generates a signal, which is obtained by attenuating at least a part of a high frequency component of the output of the temperature detecting circuit, to the compensated voltage generating part 116. The compensated voltage generating part 116 generates a temperature-compensated voltage based on a signal from the high frequency attenuating part 114.

FIGS. 4A-4C illustrate an example of a temperature, a temperature-compensated voltage, and a frequency error in the embodiment. In FIG. 4A, the actual temperature of the oscillator element 102 is indicated by a solid line and the detected temperature of the temperature detecting circuit 112 is indicated by a dotted line.

When the high power device 30 starts its operation, heat generated from the high power device 30 is immediately transmitted to the temperature detecting circuit 112 via a path with high thermal conductivity such as a ground plane of the system substrate 20 and a ground terminal of the oscillator module. As a result, as indicated by a dotted line in FIG. 4A, the temperature of the temperature detecting circuit 112 rises immediately. Accordingly, the output of the temperature detecting circuit 112 is a rising signal similar to the dotted line in FIG. 4A. Thereafter, heat generated from the high power device 30 slowly increases the temperature of the oscillator element 102. As a result, as indicated by the solid line in FIG. 4A, the temperature of the oscillator element 102 rises slowly.

In FIG. 4B, a temperature-compensated voltage which is generated by the compensated voltage generating part 116 from the high frequency attenuating part 114 when the temperature-compensated voltage generating circuit 110 according to the embodiment illustrated in FIG. 3 is used is indicated by a solid line. The temperature-compensated voltage which is generated by the compensated voltage generating part 116 when the high frequency attenuating part 114 is removed from the temperature-compensated voltage generating circuit 110 according to the embodiment illustrated in FIG. 3 is indicated by a dotted line.

As illustrated in FIG. 4B, when the high frequency attenuating part 114 is used (solid line), a high frequency component of an output with a steep rising change from the temperature detecting circuit 112 is attenuated by the high frequency attenuating part 114 and the output has a waveform with a slow change. On the other hand, when the high frequency attenuating part 114 is not used (dotted line), the output of a waveform with a steep rising change from the temperature detecting circuit 112 is directly used as the temperature-compensated voltage.

In FIG. 4C, an oscillation frequency error of the oscillator circuit 105 when the temperature-compensated voltage generating circuit 110 according to the embodiment illustrated in FIG. 3 is used is indicated by a solid line. The oscillation frequency error of the oscillator circuit 105 when the high frequency attenuating part 114 is removed from the temperature-compensated voltage generating circuit 110 according to the embodiment illustrated in FIG. 3 is indicated by a dotted line.

As illustrated in FIG. 4C, when the high frequency attenuating part 114 is used, the temperature-compensated voltage substantially matches the waveform of the temperature of the oscillator element 102 and the oscillation frequency error is very small. On the other hand, when the high frequency attenuating part 114 is not used, the temperature-compensated voltage does not match the waveform of the temperature of the oscillator element 102 and the oscillation frequency error increases.

In this way, according to the embodiment, the temperature-compensated voltage generating circuit 110 excludes a high frequency component of a temperature signal from the temperature detecting circuit 112 and mainly uses a low frequency component of the temperature signal. Accordingly, even when a steep change in temperature occurs in the temperature detecting circuit 112, the temperature-compensated voltage generating circuit 110 generates a temperature-compensated voltage which does not include a high frequency component corresponding to the steep change in temperature. Since the temperature-compensated voltage which does not include a high frequency component matches the change in temperature of a crystal resonator, the temperature-compensated voltage generating circuit 110 can decrease the oscillation frequency error.

FIG. 5 illustrates an example of a configuration of a temperature-compensated voltage generating circuit 110 according to a first modified example of the embodiment. In FIG. 5, positions of the high frequency attenuating part 114 and the compensated voltage generating part 116 in the temperature-compensated voltage generating circuit 110 illustrated in FIG. 3 are exchanged. In this case, the compensated voltage generating part 116 first generates a temperature-compensated voltage based on the output of the temperature detecting circuit 112. Then, the high frequency attenuating part 114 attenuates at least a part of a high frequency component of an output from the temperature-compensated voltage.

According to this modified example, the temperature-compensated voltage generating circuit 110 generates only a low frequency component of the temperature-compensated voltage which is generated by the compensated voltage generating part 116. Accordingly, similarly to the embodiment illustrated in FIG. 3, even when a steep change in temperature occurs in the temperature detecting circuit 112, the temperature-compensated voltage generating circuit 110 can provide the temperature-compensated voltage matching the change in temperature of a crystal resonator to the oscillator circuit 105 and decrease an oscillation frequency error.

Figure 6:
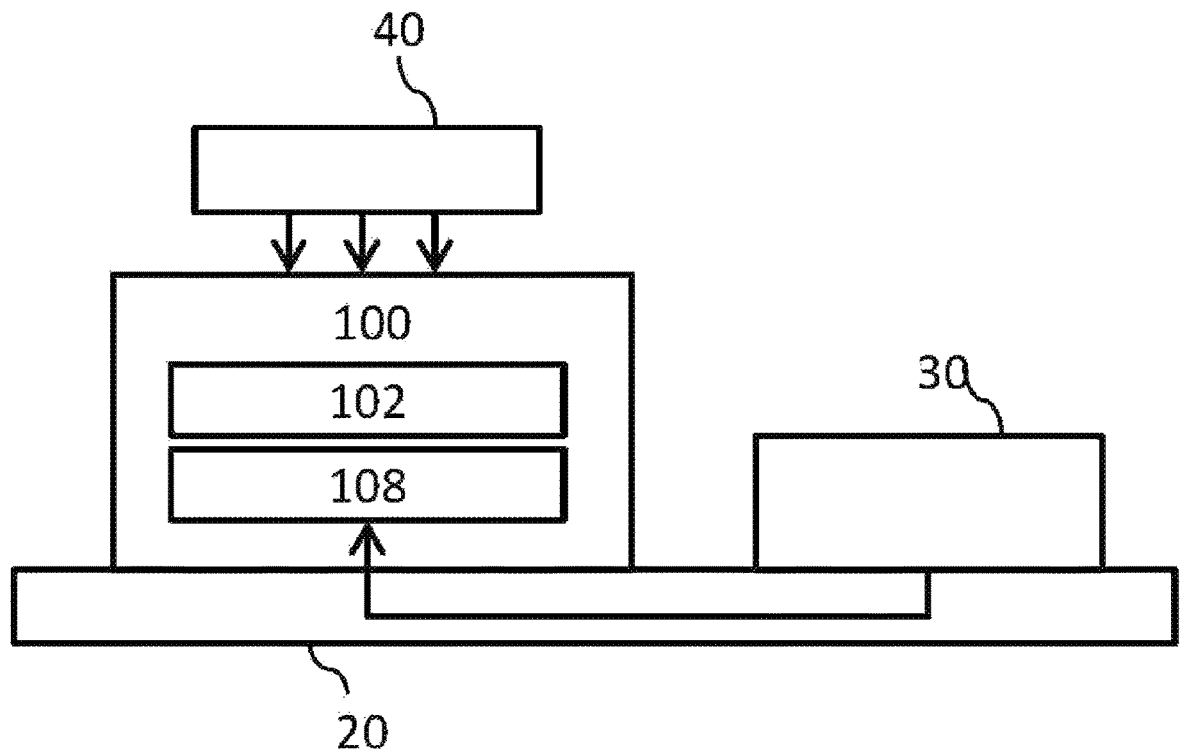
FIG. 6 illustrates an example of a configuration of a system according to a second modified example of the embodiment.

FIG. 6 illustrates an example of a configuration of a system 10 according to a second modified example of the embodiment. In this modified example, the system 10 includes a second high power device 40 in addition to the configuration illustrated in FIG. 1.

The second high power device 40 may have the same configuration as the high power device 30. The second high power device 40 is disposed at a position close to the oscillator element 102 such as an upper position of the oscillator module 100. As a result, in this modified example, the temperature of the oscillator element 102 increases by a predetermined temperature immediately after the second high power device 40 has started its operation.

Figure 7:
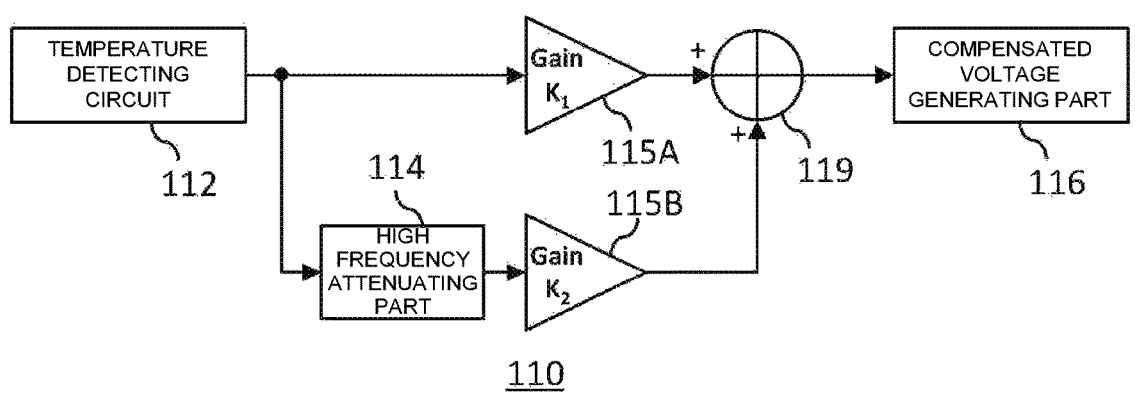
FIG. 7 illustrates an example of a configuration of a temperature-compensated voltage generating circuit according to the second modified example.

FIG. 7 illustrates an example of a configuration of a temperature-compensated voltage generating circuit 110 according to the second modified example. As illustrated in FIG. 7, the temperature-compensated voltage generating circuit 110 includes a high frequency attenuating part 114 that attenuates at least a part of a frequency component which is higher than a direct-current component of an output of the temperature detecting circuit 112, an adder 119 that adds the output of the temperature detecting circuit 112 and the output of the high frequency attenuating part 114, and a compensated voltage generating part 116 that generates a temperature-compensated voltage based on the output of the adder 119. In this modified example, the compensated voltage generating part 116 generates a temperature-compensated voltage based on both the output of the temperature detecting circuit 112 and the output of the high frequency attenuating part 114. The temperature-compensated voltage generating circuit 110 further includes a first amplifier circuit 115A and a second amplifier circuit 115B.

First, the temperature detecting circuit 112 generates a detection result to the first amplifier circuit 115A and the high frequency attenuating part 114. The first amplifier circuit 115A amplifies the output of the temperature detecting circuit with a gain K1 and generates a result to the adder 119. Here, K1 is an arbitrary real number and may be equal to or greater than 1 or may be less than 1.

The high frequency attenuating part 114 attenuates at least a part of a frequency component which is higher than the direct-current component of the output of the temperature detecting circuit 112 and generates a result to the second amplifier circuit 115B. The second amplifier circuit 115B amplifies the output of the high frequency attenuating part 114 with a gain K2 and generates a result to the adder 119. Here, K2 is an arbitrary real number and may be equal to or greater than 1 or may be less than 1.

The adder 119 generates a sum of the output of the first amplifier circuit 115A and the output of the second amplifier circuit 115B to the compensated voltage generating part 116. The compensated voltage generating part 116 generates a temperature-compensated voltage based on the output of the adder 119 and supplies the generated temperature-compensated voltage to the oscillator circuit 105.

According to this modified example, the compensated voltage generating part 116 generates the temperature-compensated voltage based on both the output of the temperature detecting circuit 112 and the low frequency component which has been extracted therefrom. Accordingly, since the temperature-compensated voltage includes a certain degree of a high frequency component, a temperature-compensated voltage matching the change in temperature can be provided to the oscillator circuit 105 even when the temperature of the oscillator element 102 increases by a predetermined temperature immediately after its operation has started.

Figure 8A:
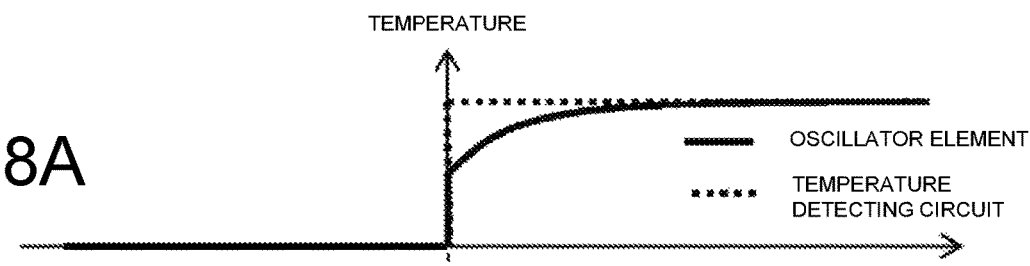
FIGS. 8A-8C illustrate an example of a detected temperature, an oscillator element temperature, and a frequency error in the second modified example.
Figure 8B:
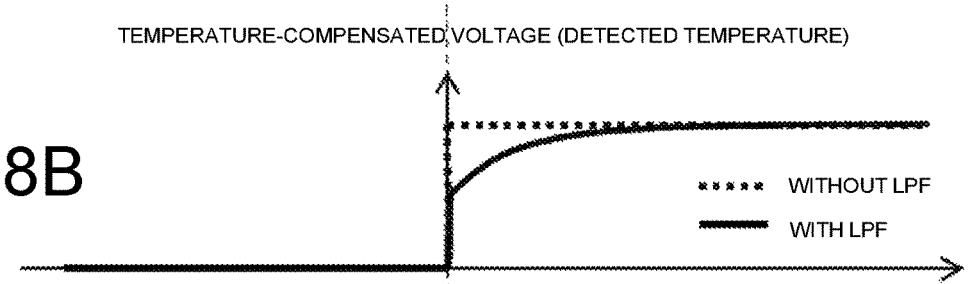
Figure 8C:
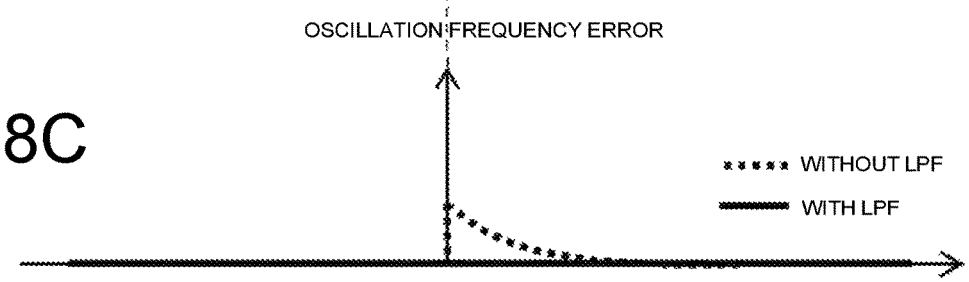

FIGS. 8A-8C illustrate an example of an element temperature, a temperature-compensated voltage, and a frequency error in the second modified example. In FIG. 8A, the actual temperature of the oscillator element 102 is indicated by a solid line and the detected temperature of the temperature detecting circuit 112 is indicated by a dotted line.

When the high power device 30 starts its operation, heat generated from the high power device 30 is immediately transmitted to the temperature-compensated voltage generating circuit 110 including the temperature detecting circuit 112 via the system substrate 20. As a result, as indicated by a dotted line in FIG. 8A, the temperature of the temperature detecting circuit 112 rises immediately. Accordingly, the output of the temperature detecting circuit 112 is a raising signal.

At the same time, heat generated from the second high power device 40 is immediately transmitted to the oscillator element 102 close thereto. Thereafter, heat generated from the high power device 30 slowly increases the temperature of the oscillator element 102. As a result, as indicated by the solid line in FIG. 8A, the temperature of the oscillator element 102 rises rapidly and then rises slowly.

As illustrated in FIG. 8B, when the high frequency attenuating part 114 is used (solid line), an output with a steep rising change from the temperature detecting circuit 112 is provided to the high frequency attenuating part 114 and a waveform with a certain slower change generated therein is used as the temperature-compensated voltage. On the other hand, when the high frequency attenuating part 114 is not used (dotted line), the output of a waveform with a steep change from the temperature detecting circuit 112 is directly used as the temperature-compensated voltage.

In FIG. 8C, an oscillation frequency error of the oscillator circuit 105 when the temperature-compensated voltage generating circuit 110 according to the embodiment illustrated in FIG. 7 is used is indicated by a solid line. The oscillation frequency error of the oscillator circuit 105 when the high frequency attenuating part 114 is removed from the temperature-compensated voltage generating circuit 110 according to the embodiment illustrated in FIG. 7 is indicated by a dotted line.

As illustrated in FIG. 8C, when the high frequency attenuating part 114 is used (solid line), the temperature-compensated voltage substantially matches the waveform of the temperature of the oscillator element 102 and the oscillation frequency error is very small. On the other hand, when the high frequency attenuating part 114 is not used (dotted line), the temperature-compensated voltage does not match the waveform of the temperature of the oscillator element 102 and the oscillation frequency error increases.

Figure 9:
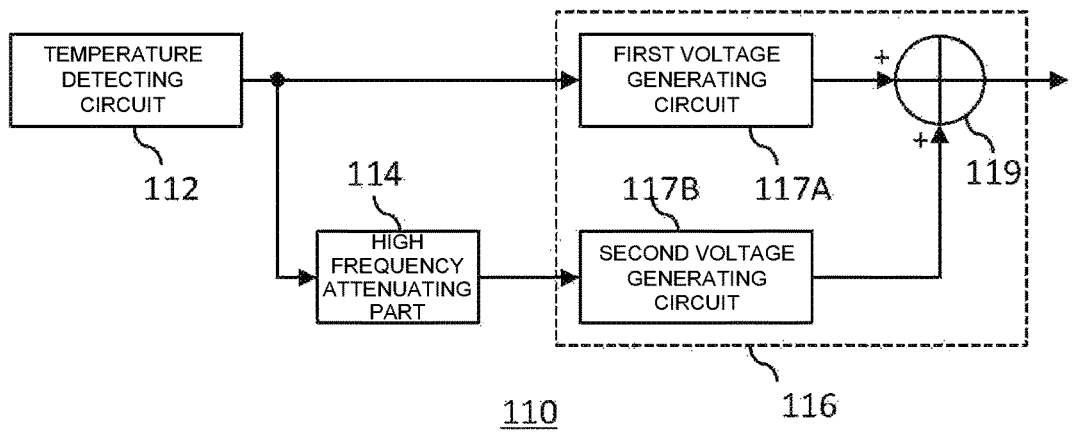
FIG. 9 illustrates an example of a configuration of a temperature-compensated voltage generating circuit according to a third modified example of the embodiment.

FIG. 9 illustrates an example of a configuration of a temperature-compensated voltage generating circuit 110 according to a third modified example of the embodiment. In this modified example, the compensated voltage generating part 116 includes a first voltage generating circuit 117A and a second voltage generating circuit 117B. The adder 119 adds the output of the first voltage generating circuit 117A and the output of the second voltage generating circuit 117B.

The first voltage generating circuit 117A generates a first temperature-compensated voltage based on the output of the temperature detecting circuit 112 and provides a first temperature-compensated voltage to the adder 119. The second voltage generating circuit 117B generates a second temperature-compensated voltage based on the output of the high frequency attenuating part 114 and provides a second temperature-compensated voltage to the adder 119. The adder 119 adds the first temperature-compensated voltage and the second temperature-compensated voltage. The first voltage generating circuit 117A and the second voltage generating circuit 117B may include circuits corresponding to a function for approximating the change in temperature of the oscillator element 102 by addition. For example, the first voltage generating circuit 117A and the second voltage generating circuit 117B may include a zeroth-order function generating circuit, a linear function generating circuit, and an Nth-order function generating circuit which have different coefficients.

In this modified example, instead of providing the sum of the output of the temperature detecting circuit 112 and the output of the high frequency attenuating part 114 and generating the temperature-compensated voltage, the temperature-compensated voltages are respectively generated based on the outputs and are added later. In this modified example, the same advantageous effects as in the second modified example, are also achieved.

Figure 10:
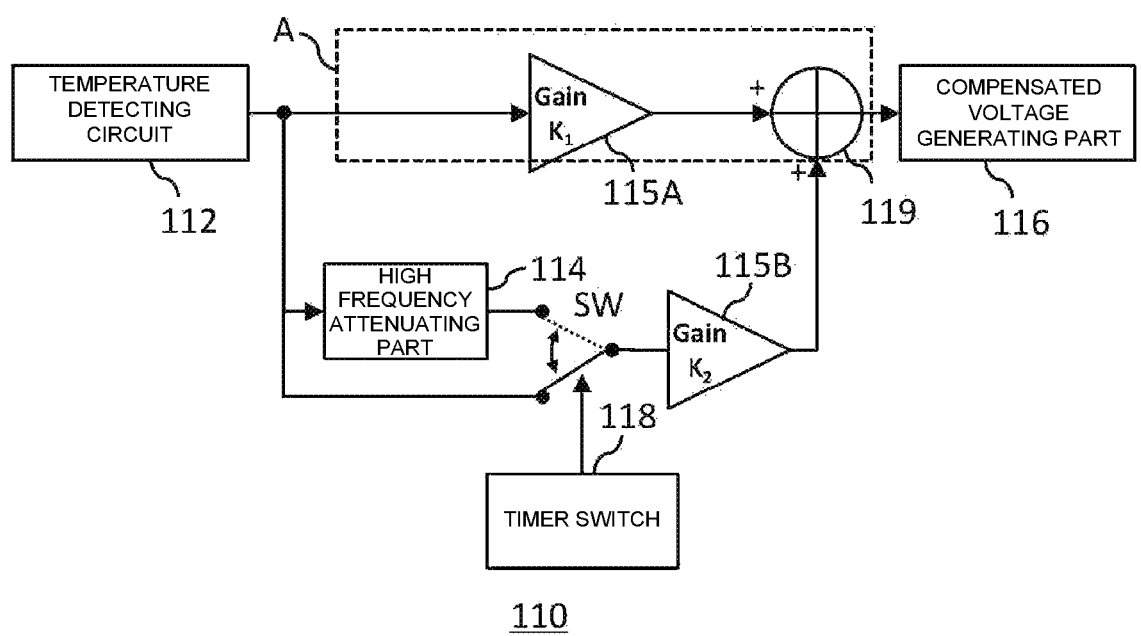
FIG. 10 illustrates an example of a configuration of a temperature-compensated voltage generating circuit according to a fourth modified example of the embodiment.

FIG. 10 illustrates an example of a configuration of a temperature-compensated voltage generating circuit 110 according to a fourth modified example of the embodiment. In this modified example, the temperature-compensated voltage generating circuit 110 includes a timer switch 118 in addition to the configuration of the second modified example illustrated in FIG. 7.

In this modified example, the high frequency attenuating part 114 includes a low pass filter. Two paths from the temperature detecting circuit 112 to the second amplifier circuit 115B are provided and the timer switch 118 switches between the two paths. That is, the temperature-compensated voltage generating circuit 110 includes a first path (a lower SW path in the drawing) along which the output of the temperature detecting circuit 112 is provided to the second amplifier circuit 115B without passing through the high frequency attenuating part 114 and a second path (an upper SW path in the drawing) along which the output of the temperature detecting circuit 112 is provided to the second amplifier circuit 115B via the high frequency attenuating part 114.

The timer switch 118 switches the first path to the second path in a predetermined time after the temperature-compensated voltage generating circuit 110 has been powered on. Accordingly, the temperature-compensated voltage generating circuit 110 operates without using the high frequency attenuating part 114 in a predetermined time after the temperature-compensated voltage generating circuit 110 has been powered on and then operates using the high frequency attenuating part 114.

FIGS. 11A-11E illustrates an example of a detected temperature, an oscillator element temperature, and a frequency error in the fourth modified example. FIG. 11A illustrates a source voltage after the operation has been started. As illustrated in the drawing, the source voltage of the temperature-compensated voltage generating circuit 110 increases immediately after the operation has been started.

FIG. 11B illustrates switching using the timer switch 118. As illustrated in the drawing, the timer switch 118 is in an ON state in a predetermined time after the operation has been started and thus provides the first path not passing through the high frequency attenuating part 114. Thereafter, the timer switch 118 is switched to an OFF state when a predetermined time has elapsed after it has been powered on and thus provides the second path passing through the high frequency attenuating part 114.

FIG. 11C illustrates the actual temperature of the oscillator element 102. As illustrated in the drawing, the temperature of the oscillator element 102 increases slowly by a predetermined degree due to self-heating or the like immediately after it has been powered on and then increases further due to transmission of heat from the high power device 30 after the high power device 30 has been started.

In FIG. 11D, the temperature-compensated voltage which is generated by the compensated voltage generating part 116 from the adder 119 when the temperature-compensated voltage generating circuit 110 according to the modified example illustrated in FIG. 10 is used is indicated by a solid line. The temperature-compensated voltage which is generated by the compensated voltage generating part 116 when the timer switch 118 is removed from the temperature-compensated voltage generating circuit 110 according to the fourth modified example illustrated in FIG. 10 and the first path is always used is indicated by a dotted line.

As illustrated in the drawing, when the high frequency attenuating part 114 is removed and only the first path is used, change in frequency due to transmission of heat from the high power device 30 is caused. On the other hand, with the temperature-compensated voltage generating circuit 110 according to the fourth modified example, the change in frequency due to transmission of heat from the high power device 30 is suppressed.

Here, slight change in frequency is caused immediately after the timer switch 118 has been switched (a settling period in the drawing). This is because behavior for filling a gap due to an input conversion offset of the Gm cell of the low pass filter of the high frequency attenuating part 114 is occurred when change to the path passing through the high frequency attenuating part 114 is performed by switching in the fourth modified example. The input conversion offset will be described below with reference to FIG. 12.

Figure 12:
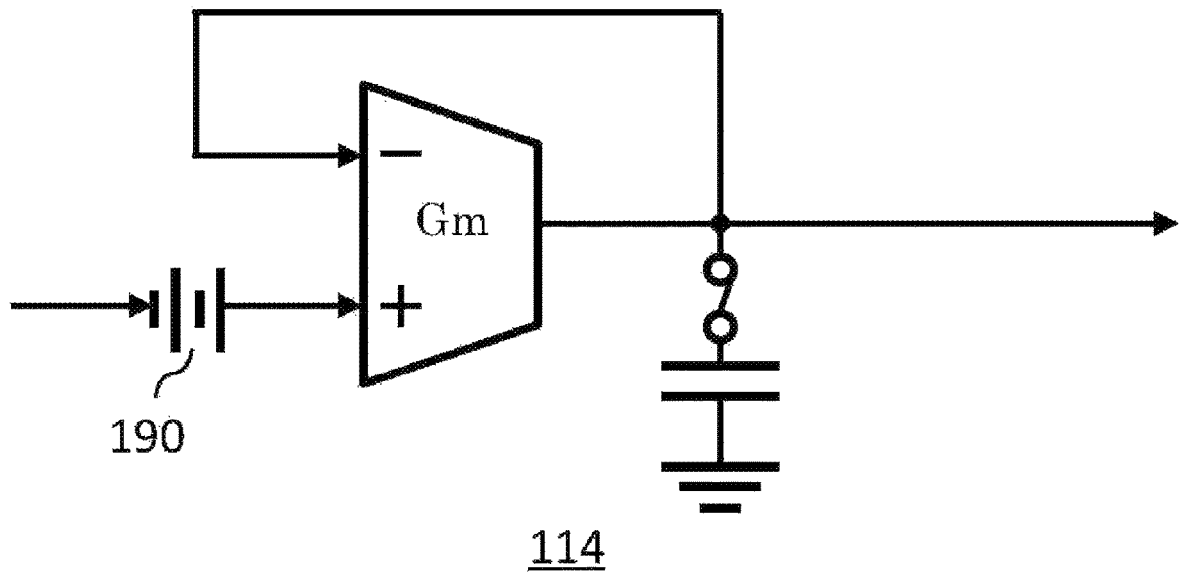
FIG. 12 illustrates an example of a configuration of a high frequency attenuating part using a Gm-C filter.

FIG. 12 illustrates an example of a configuration of the high frequency attenuating part 114 using a Gm-C filter. The high frequency attenuating part 114 may be embodied by a Gm-C filter including a Gm cell illustrated in FIG. 12. The high frequency attenuating part 114 includes an input conversion offset 190. A time constant of heat transmission is normally, for example, several tens of seconds, and a Gm value for realizing the time constant using a capacitor with several tens of pF in the integrated circuit is about 1 pA/V, which is very small. Accordingly, the input conversion offset 190 has the order of 100 mV, which is very great.

In this way, when the system 10 is powered on, the frequency may not be stabilized due to the Gm cell of the high frequency attenuating part 114 and settling may be maintained for several seconds. On the other hand, for specific applications, settling may have to be completed immediately (for example, within several milliseconds) after it has been powered on. Therefore, in another modified example which will be described below, the temperature-compensated voltage generating circuit 110 may include a timer switch that controls the operation or the output destination of the high frequency attenuating part 114 depending on the time and decrease the settling immediately after the temperature-compensated voltage generating circuit 110 has been powered on using the timer switch.

Figure 13:
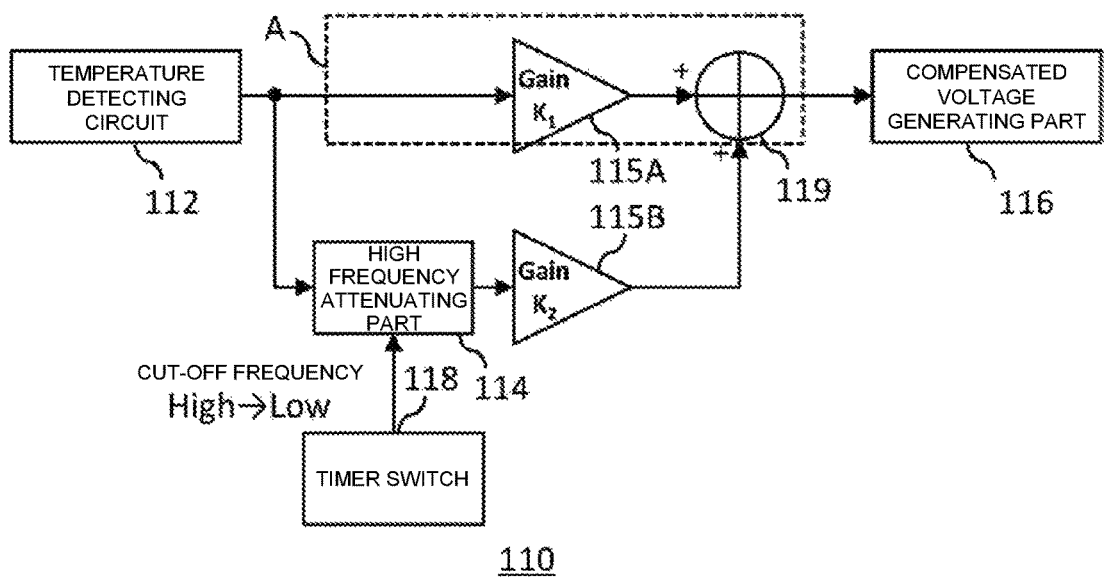
FIG. 13 illustrates an example of a configuration of a temperature-compensated voltage generating circuit according to a fifth modified example of the embodiment.

FIG. 13 illustrates an example of a configuration of a temperature-compensated voltage generating circuit 110 according to a fifth modified example of the embodiment. In this modified example, the temperature-compensated voltage generating circuit 110 includes a timer switch 118 in addition to the configuration of the second modified example illustrated in FIG. 7.

In this modified example, the high frequency attenuating part 114 includes a low pass filter. The timer switch 118 switches a cut-off frequency of the low pass filter of the high frequency attenuating part 114 from a first frequency to a second frequency which is lower than the first frequency when a predetermined time has elapsed after the temperature-compensated voltage generating circuit 110 has been powered on. For example, the timer switch 118 may read parameters related to the cut-off frequency stored in the memory 200 and change the cut-off frequency of the low pass filter. A configuration in which a part surrounded by a broken line A (the first amplifier circuit 115A and the adder 119) are removed from the configuration illustrated in FIGS. 10 and 13 may be used.

Figure 14:
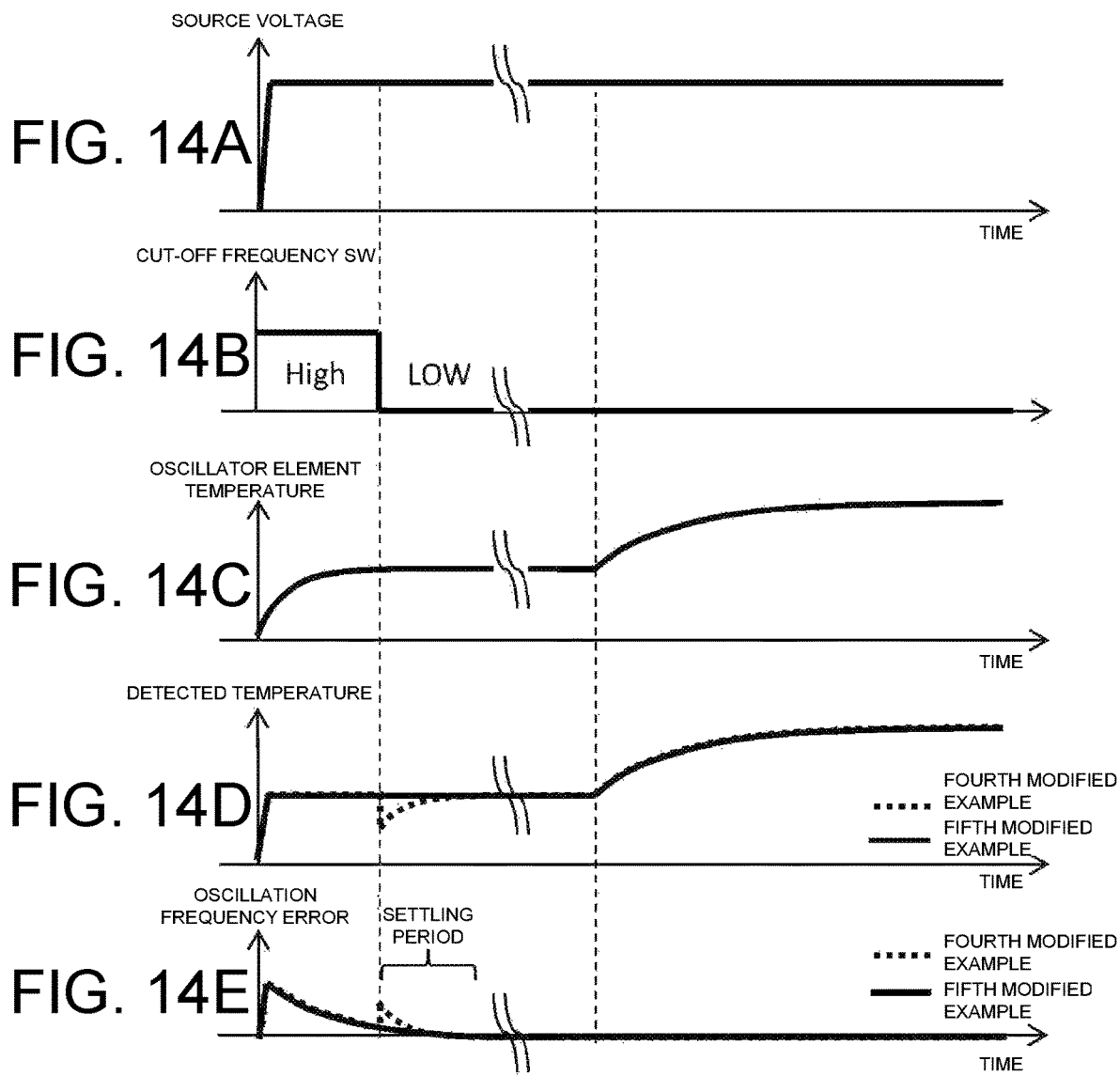
FIGS. 14A-14E illustrate an example of a detected temperature, an oscillator element temperature, and a frequency error in the fifth modified example.

FIGS. 14A-14E illustrates an example of a detected temperature, an oscillator element temperature, and a frequency error in the fifth modified example. FIG. 14A illustrates a source voltage after the operation has been started. As illustrated in the drawing, the source voltage of the temperature-compensated voltage generating circuit 110 increases immediately after the operation has been started.

FIG. 14B illustrates switching using the timer switch 118. As illustrated in the drawing, the timer switch 118 maintains the cut-off frequency at the first frequency which has been initially set in a predetermined time after the operation has been started. Thereafter, the timer switch 118 switches the cut-off frequency to the second frequency which is lower than the first frequency when a predetermined time has elapsed after the temperature-compensated voltage generating circuit 110 has been powered on.

FIG. 14C illustrates the actual temperature of the oscillator element 102. The change in temperature is the same as illustrated in FIG. 11C.

Figure 11:
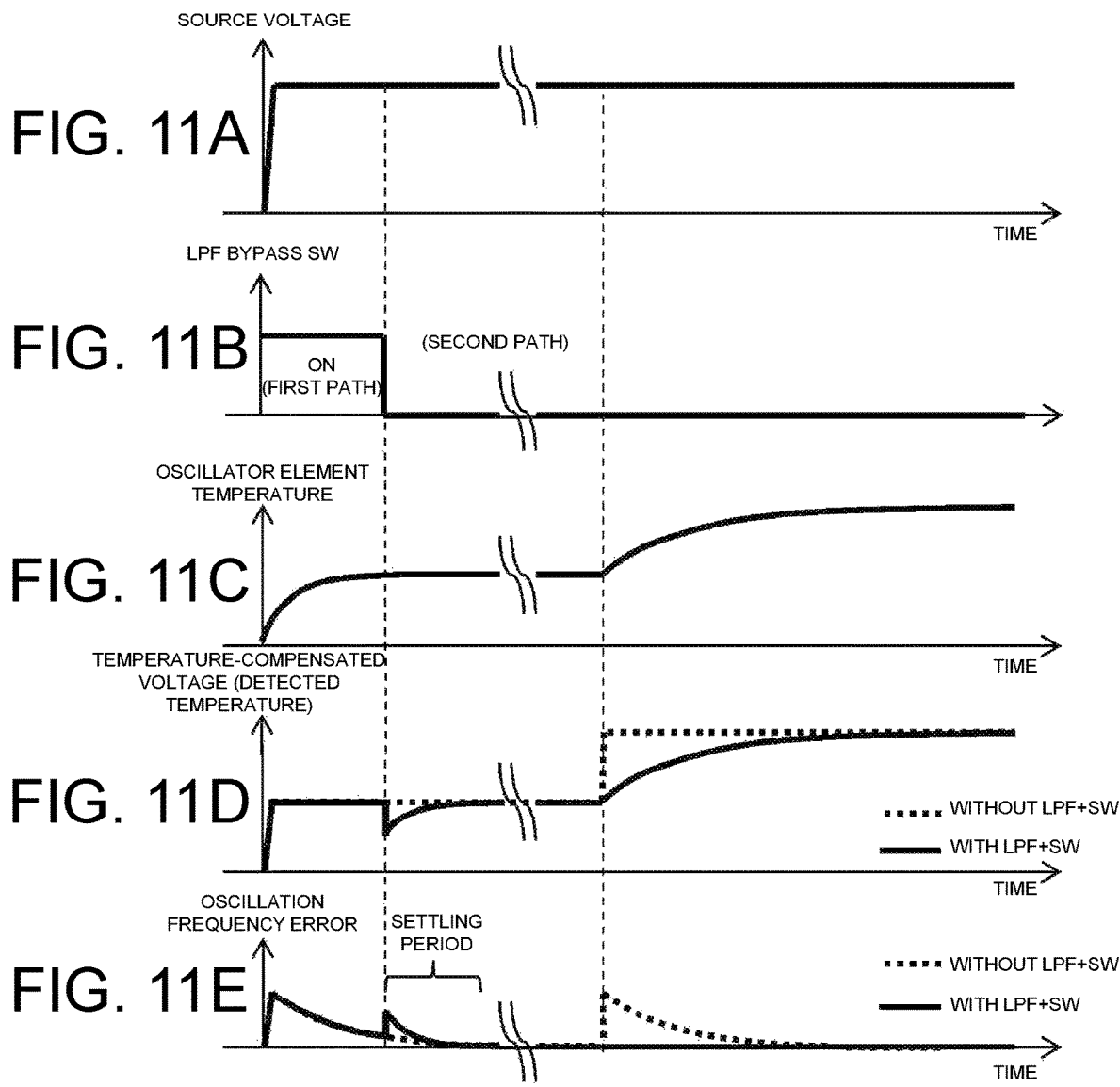
FIGS. 11A-11E illustrate an example of a detected temperature, an oscillator element temperature, and a frequency error in the fourth modified example.

In FIG. 14D, the temperature-compensated voltage which is generated by the compensated voltage generating part 116 from the adder 119 when the temperature-compensated voltage generating circuit 110 according to the modified example illustrated in FIG. 13 is used is indicated by a solid line. The temperature-compensated voltage which is generated by to the compensated voltage generating part 116 in the fourth modified example illustrated in FIG. 11 is indicated by a dotted line.

In the fourth modified example indicated by the dotted line, slight change in frequency is caused immediately after the timer switch 118 has been switched (a settling period in the drawing). On the other hand, with the temperature-compensated voltage generating circuit 110 according to this modified example, it is possible to decrease the change in frequency immediately after switching in comparison with the fourth modified example. This is because change to the path passing through the high frequency attenuating part 114 is not performed by switching and thus the behavior for filling an offset gap of the Gm cell is not generated in the fifth modified example.

Figure 15:
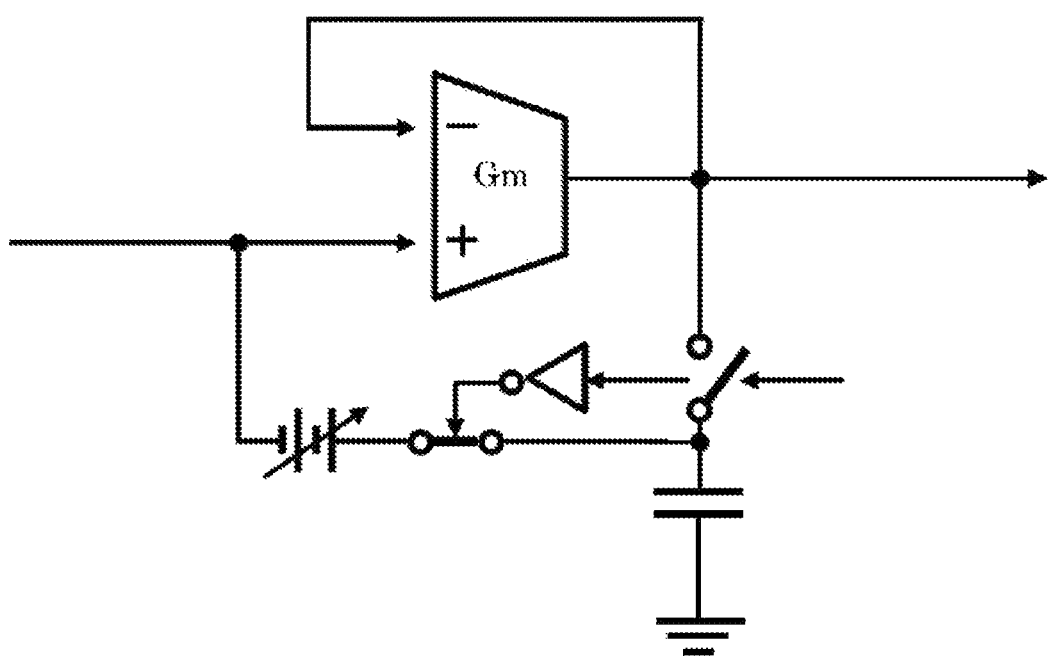
FIG. 15 illustrates an example of a configuration of a high frequency attenuating part according to the fifth modified example.
Figure 16:
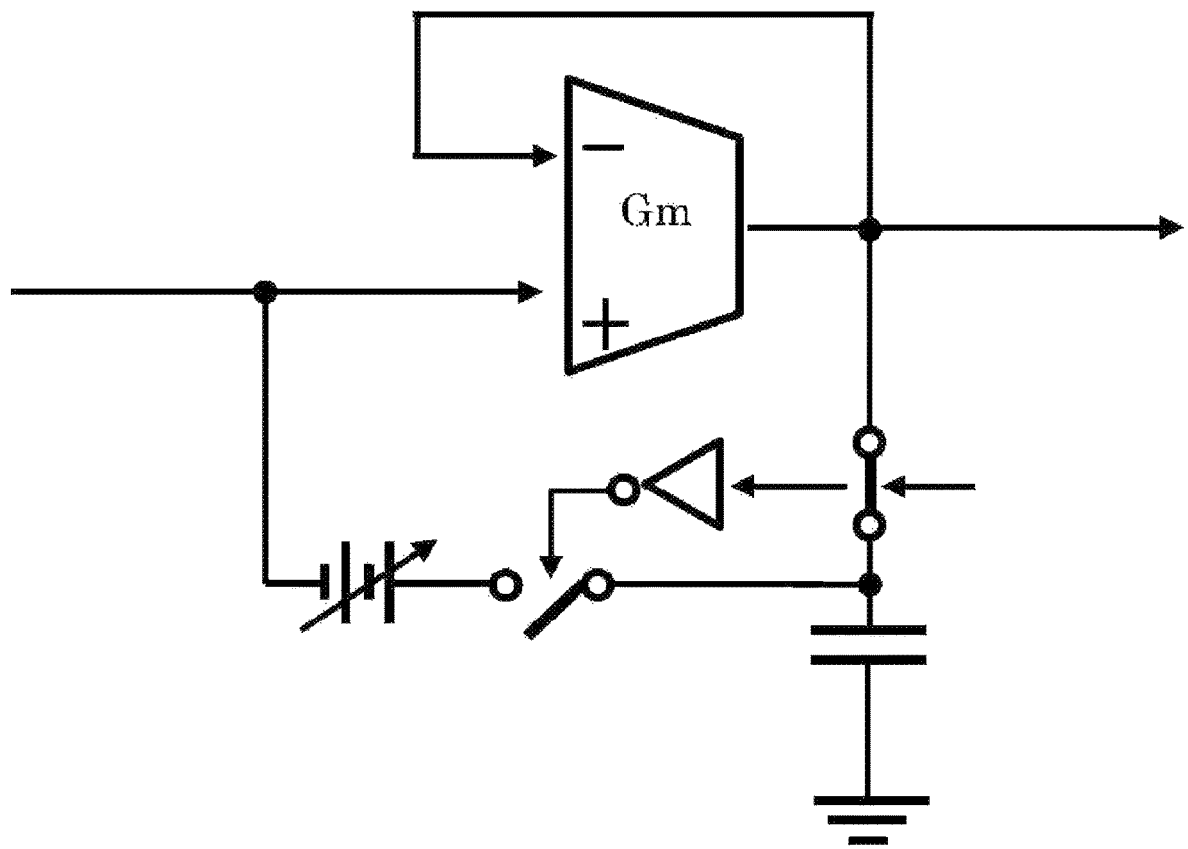
FIG. 16 illustrates an example of a configuration of a high frequency attenuating part according to the fifth modified example.

FIGS. 15 and 16 illustrate an example of a configuration of the high frequency attenuating part 114 according to the fifth modified example. For example, the high frequency attenuating part 114 may include a Gm-C filter, have a circuit configuration illustrated in FIG. 15 at a high cut-off frequency, and have a circuit configuration illustrated in FIG. 16 at a low cut-off frequency. As illustrated in the drawing, the capacitor in the high frequency attenuating part 114 is detached from the Gm cell at a high cut-off frequency and is pre-charged with an input-side voltage of which an offset has been adjusted. At a low cut-off frequency, the capacitor is detached from the input-side voltage and is connected to the output of the Gm cell.

Figure 17:
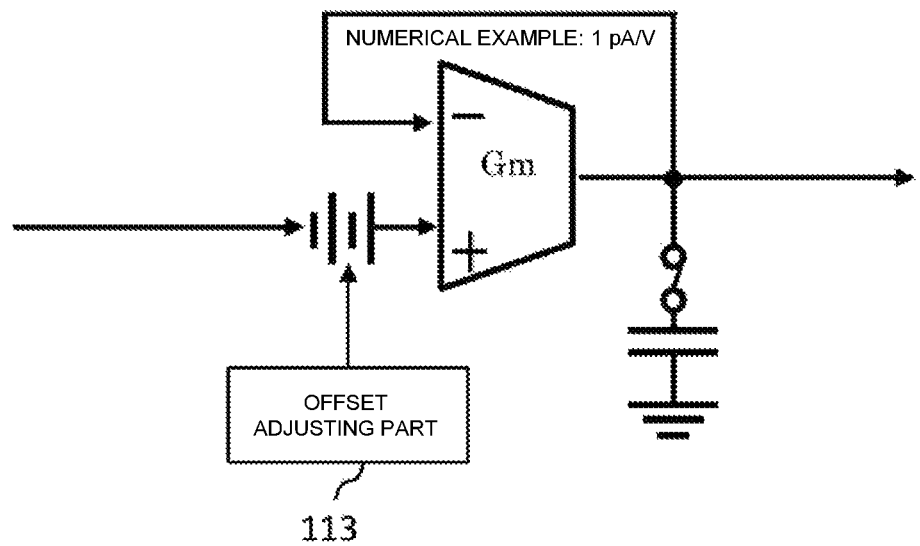
FIG. 17 illustrates an example of a configuration of a high frequency attenuating part according to a sixth modified example of the embodiment.

FIG. 17 illustrates an example of a configuration of a high frequency attenuating part 114 according to a sixth modified example of the embodiment. In this modified example, the high frequency attenuating part 114 is a low pass filter which is mounted by a Gm-C filter and further includes an offset adjusting part 113.

The offset adjusting part 113 adjusts the offset of the Gm cell. For example, the offset adjusting part 113 reads a numerical value of the offset from the memory 200 and sets the input conversion offset of the Gm cell based on the read numerical value. For example, in a stage in which the oscillator module 100 is manufactured, a numerical value of an offset may be written to an EEPROM from the outside and the offset adjusting part 113 may be caused to adjust the offset of the Gm cell using the numerical value, after the oscillator module 100 has been assembled (for example, after the oscillator circuit 105 and the temperature-compensated voltage generating circuit 110 have been integrated). In another example, the offset adjusting part 113 may adjust the offset using a fuse after assembly.

Accordingly, after the oscillator circuit 105 has been assembled into an IC such as the temperature-compensated voltage generating circuit 110, the offset of the Gm cell can be appropriately adjusted depending on characteristics of each element. According to this modified example, an operating point of the compensated voltage generating part 116 that drives the oscillator circuit 105 can be easily designed.

Figure 18:
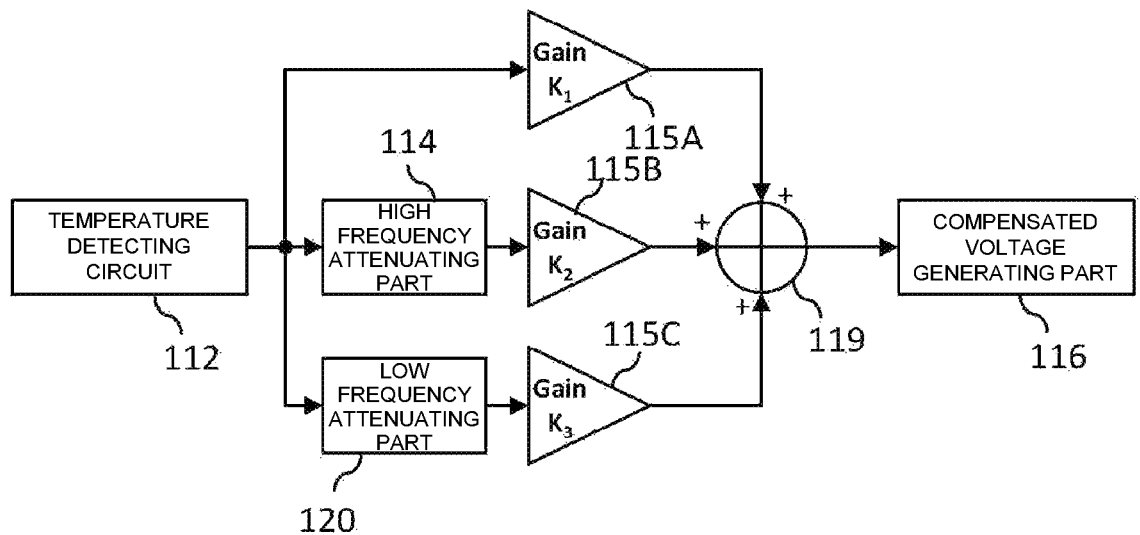
FIG. 18 illustrates an example of a configuration of a temperature-compensated voltage generating circuit according to a seventh modified example of the embodiment.

FIG. 18 illustrates an example of a configuration of a temperature-compensated voltage generating circuit 110 according to a seventh modified example of the embodiment. In this modified example, the compensated voltage generating part 116 generates a temperature-compensated voltage based on an output of the temperature detecting circuit 112 and outputs of the high frequency attenuating part 114 and the low frequency attenuating part 120. The temperature-compensated voltage generating circuit 110 further includes a low frequency attenuating part 120 and a third amplifier circuit 115C in addition to the configuration according to the second modified example.

The low frequency attenuating part 120 attenuates at least a part of a low frequency component which is provided from the temperature detecting circuit 112. For example, the low frequency attenuating part 120 may be a high pass filter (HPF).

First, the temperature detecting circuit 112 generates a result of detection to the first amplifier circuit 115A, the high frequency attenuating part 114, and the low frequency attenuating part 120. The first amplifier circuit 115A amplifies the output of the temperature detecting circuit with a gain $K_1$ and provides the amplified output to the adder 119.

The high frequency attenuating part 114 attenuates at least a part of a high frequency component of an input signal and generates the attenuated signal to the second amplifier circuit 115B. The second amplifier circuit 115B amplifies the output of the high frequency attenuating part 114 with a gain $K_2$ and provides the amplified output to the adder 119.

The low frequency attenuating part 120 attenuates at least a part of a low frequency component of the input signal and provides the attenuated signal to the third amplifier circuit 115C. The third amplifier circuit 115C amplifies the output of the low frequency attenuating part 120 with a gain $K_3$ and provides the amplified output to the adder 119. Here, K3 is an arbitrary real number and may be equal to or greater than 1 or may be less than 1.

The adder 119 provides an addition result of the output of the first amplifier circuit 115A, the output of the second amplifier circuit 115B, and the output of the third amplifier circuit 115C to the compensated voltage generating part 116. The compensated voltage generating part 116 generates a temperature-compensated voltage based on the output of the adder 119 and supplies the generated temperature-compensated voltage to the oscillator circuit 105.

According to this modified example, the compensated voltage generating part 116 generates the temperature-compensated voltage based on all the outputs of the temperature detecting circuit 112, the extracted low frequency component, and the extracted high frequency component. Accordingly, since the temperature-compensated voltage includes the low frequency component and the high frequency component to a certain extent, a temperature-compensated voltage matching the change in temperature can be provided to the oscillator circuit 105 even when the temperature of the oscillator element 102 increases by a predetermined degree immediately after the operation has been started.

Figure 19A:
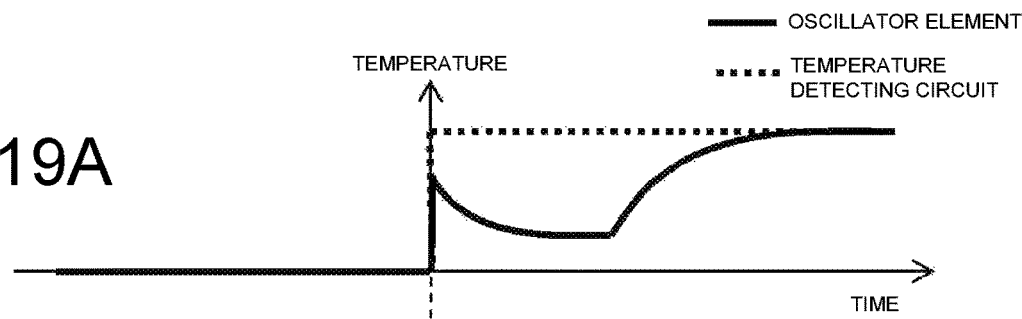
FIGS. 19A-19C illustrates an example of a detected temperature, an oscillator element temperature, and a frequency error in the seventh modified example.
Figure 19B:
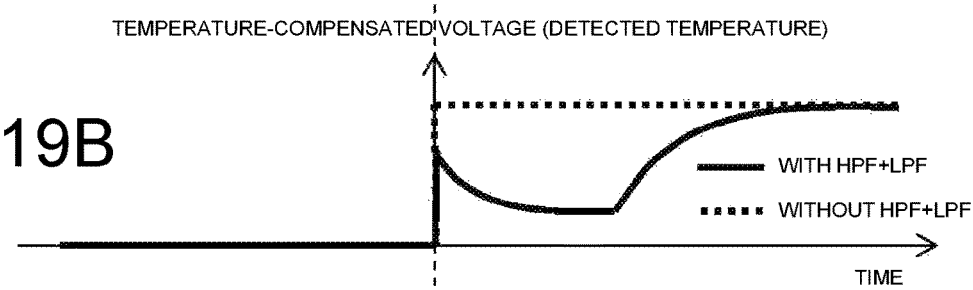
Figure 19C:
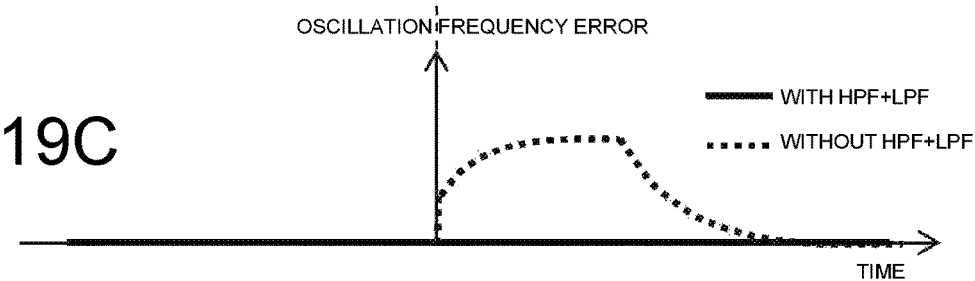

FIGS. 19A-19C illustrates an example of a detected temperature, an oscillator element temperature, and a frequency error in the seventh modified example. In FIG. 19A, the actual temperature of the oscillator element 102 is indicated by a solid line and the detected temperature of the temperature detecting circuit 112 is indicated by a dotted line.

In the system 10 illustrated in FIG. 6, when the high power device 30 and the second high power device 40 start their operations, heat generated from the high power device 30 is immediately transmitted to the temperature-compensated voltage generating circuit 110 including the temperature detecting circuit 112 via the system substrate 20.

Accordingly, as indicated by the dotted line in FIG. 19A, the temperature of the temperature detecting circuit 112 rises immediately. As a result, the output of the temperature detecting circuit 112 is also a raising signal similarly to the dotted line in FIG. 19A.

Heat generated from the second high power device 40 is immediately transmitted to the oscillator element 102 which is close thereto and the temperature of the oscillator element 102 increases. Thereafter, when the second high power device 40 temporarily stops the operation, the temperature of the oscillator element 102 falls.

Thereafter, heat generated from the high power device 30 slowly increases the temperature of the oscillator element 102. As a result, as indicated by the solid line in FIG. 19A, the temperature of the oscillator element 102 rises immediately, falls once, and then rises slowly.

As illustrated in FIG. 19B, when the high frequency attenuating part 114 is used (solid line), the output with a steep rising change from the temperature detecting circuit 112 is attenuated to a certain degree of change by the high frequency attenuating part 114. The waveform which is attenuated by the high frequency attenuating part 114 is used as a part of the temperature-compensated voltage.

The output with a steep rising change from the temperature detecting circuit 112 is used as a part of the temperature-compensated voltage via the low frequency attenuating part 120 without any change. On the other hand, when the high frequency attenuating part 114 and the low frequency attenuating part 120 are not used (dotted line), the output of a waveform with a steep change from the temperature detecting circuit 112 is directly used as the temperature-compensated voltage.

In FIG. 19C, an oscillation frequency error of the oscillator circuit 105 when the temperature-compensated voltage generating circuit 110 according to the embodiment illustrated in FIG. 18 is used is indicated by a solid line. The oscillation frequency error of the oscillator circuit 105 when the high frequency attenuating part 114 and the low frequency attenuating part 120 are removed from the temperature-compensated voltage generating circuit 110 according to the embodiment illustrated in FIG. 18 is indicated by a dotted line.

As illustrated in FIG. 19C, when the high frequency attenuating part 114 and the low frequency attenuating part 120 are used together (solid line), the temperature-compensated voltage substantially matches the waveform of the temperature of the oscillator element 102 and thus the oscillation frequency error is very small. On the other hand, when the high frequency attenuating part 114 and the low frequency attenuating part 120 are not used (dotted line), the temperature-compensated voltage does not match the waveform of the temperature of the oscillator element 102 and the oscillation frequency error increases.

As described in the above-mentioned embodiment and the modified examples thereof, the temperature-compensated voltage generating circuit 110 can cause the output of the temperature detecting circuit 112 to approximate the change in temperature of the oscillator element 102 using the high frequency attenuating part 114 or the like and thus decrease the oscillation frequency error of the oscillator circuit 105 due to the change in temperature.

Figure 20:
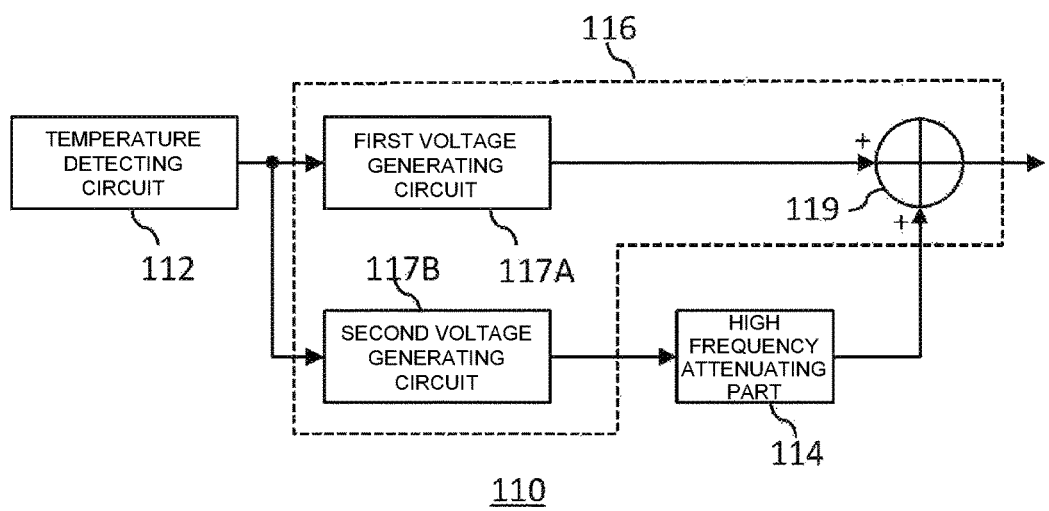
FIG. 20 illustrates an example of a configuration of a temperature-compensated voltage generating circuit according to an eighth modified example.

FIG. 20 illustrates an example of a configuration of a temperature-compensated voltage generating circuit 110 according to an eighth modified example of the embodiment. In this modified example, similarly to the third modified example, the compensated voltage generating part 116 includes a first voltage generating circuit 117A, a second voltage generating circuit 117B, and an adder 119. In this modified example, the high frequency attenuating part 114 is disposed in a rear stage of the second voltage generating circuit 117B, not in a front stage of the second voltage generating circuit 117B.

Accordingly, the second voltage generating circuit 117B generates a second temperature-compensated voltage based on the output of the temperature detecting circuit 112 and provides the second temperature-compensated voltage to the high frequency attenuating part 114. The adder 119 adds the first temperature-compensated voltage generated by the first voltage generating circuit 117A and the output of the high frequency attenuating part 114. In this modified example, the same advantageous effects as in the third modified example are achieved.

Figure 21:
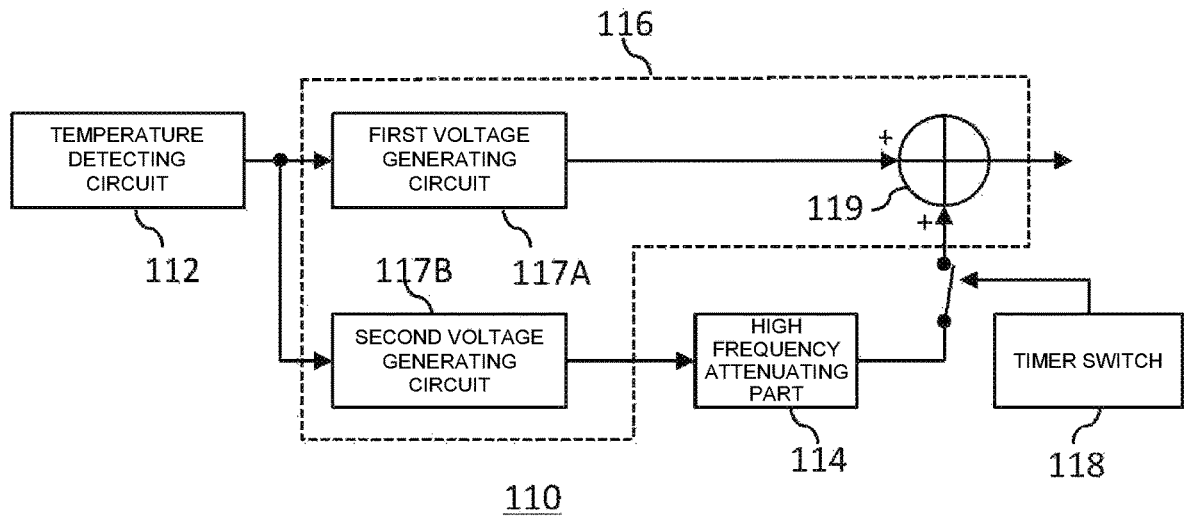
FIG. 21 illustrates an example of a configuration of a temperature-compensated voltage generating circuit according to a ninth modified example.

FIG. 21 illustrates an example of a configuration of a temperature-compensated voltage generating circuit 110 according to a ninth modified example of the embodiment. In this modified example, a timer switch 118 is further provided in addition to the configuration of the eighth modified example. The timer switch 118 cuts off a path between the high frequency attenuating part 114 and the adder 119 in a predetermined period after the temperature-compensated voltage generating circuit 110 has been powered on. In this modified example, similarly to the fourth modified example, the temperature-compensated voltage generating circuit 110 achieves an effect of attenuation of a high frequency only when necessary. Similarly to the fifth modified example, a configuration in which the high frequency attenuating part 114 includes a low pass filter and the timer switch 118 switches the cut-off frequency of the low pass filter of the high frequency attenuating part 114 from a first frequency to a second frequency which is lower than the first frequency may be used.

Figure 22:
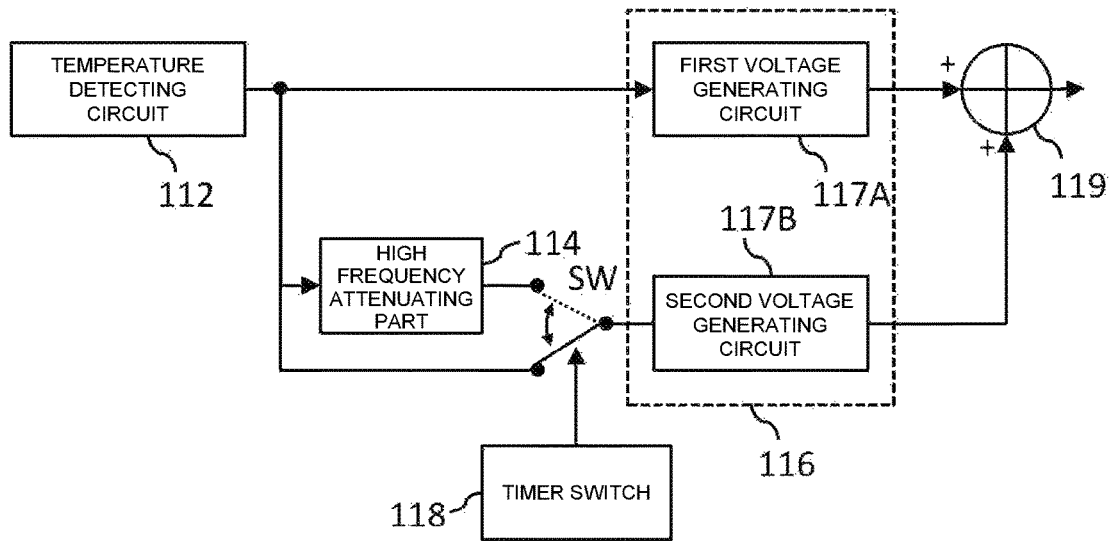
FIG. 22 illustrates an example of a configuration of a temperature-compensated voltage generating circuit according to a tenth modified example.

FIG. 22 illustrates an example of a configuration of a temperature-compensated voltage generating circuit 110 according to a tenth modified example of the embodiment. In this modified example, similarly to the third modified example, the compensated voltage generating part 116 includes a first voltage generating circuit 117A, a second voltage generating circuit 117B, and an adder 119. In this modified example, a first path along which the output of the temperature detecting circuit 112 is provided to the second voltage generating circuit 117B without passing through the high frequency attenuating part 114 and a second path along which the output of the temperature detecting circuit 112 is provided to the second voltage generating circuit 117B via the high frequency attenuating part 114 are provided from the temperature detecting circuit 112 to the second voltage generating circuit 117B.

The temperature-compensated voltage generating circuit 110 further includes a timer switch 118 that switches between the two paths. For example, the timer switch 118 switches the first path to the second path when a predetermined time has elapsed after the temperature-compensated voltage generating circuit 110 has been powered on. In this modified example, similarly to the fourth modified example, the temperature-compensated voltage generating circuit 110 achieves an effect of attenuation of a high frequency only when necessary. Similarly to the fifth modified example, a configuration in which the high frequency attenuating part 114 includes a low pass filter and the timer switch 118 switches the cut-off frequency of the low pass filter of the high frequency attenuating part 114 from a first frequency to a second frequency which is lower than the first frequency may be used.

In the above-mentioned embodiment, a crystal resonator is used as the oscillator element 102 of an oscillator, but, for example, a surface acoustic wave (SAW) resonator, an AT-cut crystal resonator, an SC-cut crystal resonator, a tuning-fork crystal resonator, other piezoelectric resonators, or a Micro Electro Mechanical Systems (MEMS) resonator can be used as the oscillator element. Piezoelectric materials such as piezoelectric single crystals such as quartz, lithium tantalate, lithium niobate, and langatate, piezoelectric ceramics such as lead titanate zirconate, or silicon semiconductor materials, or the like can be used as a substrate material of the oscillator element. As an excitation material for an oscillator element, a material based on a piezoelectric effect may be used or electrostatic driving using a Coulomb force may be used.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

It should be noted that processes such as operations, procedures, steps, and phases in a device, a system, a program, and a method which are described in the claims, the specification, and the drawings can be implemented in an arbitrary order as long as "before," "prior to," or the like is not particularly mentioned and an output of a previous process is not used as a subsequent process. Although operation flows in the claims, the specification, and the drawings are described using "first," "then," or the like for the purpose of convenience, it does not mean that it is essential to perform the operation flows in that order.

What is claimed is:

1. A temperature-compensated voltage generating circuit that generates a temperature-compensated voltage which is supplied to an oscillator circuit, comprising:
   a temperature detecting circuit that detects a temperature;
   a high frequency attenuating part that attenuates at least a part of a frequency component which is higher than a direct-current component of an output of the temperature detecting circuit;
   an adder that adds the output of the temperature detecting circuit and an output of the high frequency attenuating part;
   a compensated voltage generating part that generates the temperature-compensated voltage based on an output of the adder;
   a first amplifier circuit that is connected between the temperature detecting circuit and the adder; and
   a second amplifier circuit that is connected between the high frequency attenuating part and the adder.

2. The temperature-compensated voltage generating circuit according to claim 1, further comprising a timer switch that controls an operation or an output destination of the high frequency attenuating part depending on time.

3. The temperature-compensated voltage generating circuit according to claim 2, further comprising:
   a first path along which the output of the temperature detecting circuit is provided to the second amplifier circuit without passing through the high frequency attenuating part; and
   a second path along which the output of the temperature detecting circuit is provided to the second amplifier circuit via the high frequency attenuating part,
   wherein the timer switch switches the first path to the second path after a predetermined time after the temperature-compensated voltage generating circuit has been powered on.

4. The temperature-compensated voltage generating circuit according to claim 3, wherein the timer switch cuts off a path between the high frequency attenuating part and the adder in the predetermined period after the temperature-compensated voltage generating circuit has been powered on.

5. The temperature-compensated voltage generating circuit according to claim 2, wherein the high frequency attenuating part includes a low pass filter, and
   wherein the timer switch switches a cut-off frequency of the low pass filter from a first frequency to a second frequency which is lower than the first frequency after a predetermined time after the temperature-compensated voltage generating circuit has been powered on.

6. The temperature-compensated voltage generating circuit according to claim 1, further comprising:
   a low frequency attenuating part that attenuates at least a part of a low frequency component which is generated by the temperature detecting circuit; and
   a third amplifier circuit that amplifies an output of the low frequency attenuating part,
   wherein the adder adds an output of the first amplifier circuit, an output of the second amplifier circuit, and an output of the third amplifier circuit.

7. The temperature-compensated voltage generating circuit according to claim 1, wherein the high frequency attenuating part includes at least one of a low pass filter, an integrator, a step wave generating circuit, and a ramp wave generating circuit.

8. The temperature-compensated voltage generating circuit according to claim 7, wherein the high frequency attenuating part is a low pass filter including a Gm-C filter using a Gm cell.

9. The temperature-compensated voltage generating circuit according to claim 8, wherein the high frequency attenuating part further includes an offset adjusting part that adjusts an offset of the Gm cell.

10. The temperature-compensated voltage generating circuit according to claim 1, wherein the compensated voltage generating part includes an Nth-order function generating circuit.

11. An oscillator module, comprising:
the temperature-compensated voltage generating circuit according to claim 1;
an oscillator circuit that is provided close to the temperature-compensated voltage generating circuit and is supplied with the temperature-compensated voltage that is generated by the temperature-compensated voltage generating circuit; and
an oscillator element that is driven by the oscillator circuit.

12. A system, comprising the oscillator module according to claim 11.

13. The system according to claim 12, further comprising a communication circuit.

14. A method of manufacturing an integrated circuit including the temperature-compensated voltage generating circuit according to claim 13; and an oscillator circuit that is provided close to the temperature-compensated voltage generating circuit and is driven with the temperature-compensated voltage that is generated by the temperature-compensated voltage generating circuit, the method comprising:
an offset adjusting step of adjusting an offset of a Gm cell after the integrated circuit has been assembled.

15. A temperature-compensated voltage generating circuit that generates a temperature-compensated voltage which is supplied to an oscillator circuit, comprising:
a temperature detecting circuit that detects a temperature;
a high frequency attenuating part that attenuates at least a part of a frequency component which is higher than a direct-current component of an output of the temperature detecting circuit;
an adder that adds the output of the temperature detecting circuit and an output of the high frequency attenuating part;
a compensated voltage generating part that generates the temperature-compensated voltage based on an output of the adder; and
a timer switch that controls an operation or an output destination of the high frequency attenuating part depending on time.

* * * * *